United States Patent
Gallmeier et al.

(10) Patent No.: US 8,841,159 B2
(45) Date of Patent: Sep. 23, 2014

(54) CONTACTING AN OPTOELECTRONIC SEMICONDUCTOR COMPONENT THROUGH A CONVERSION ELEMENT AND CORRESPONDING OPTOELECTRONIC SEMICONDUCTOR COMPONENT

(75) Inventors: Hans-Christoph Gallmeier, Regensburg (DE); Michael Kruppa, Regensburg (DE); Raimund Schwarz, Regensburg (DE); Guenter Spath, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/500,685

(22) PCT Filed: Sep. 27, 2010

(86) PCT No.: PCT/EP2010/064241
§ 371 (c)(1),
(2), (4) Date: Apr. 6, 2012

(87) PCT Pub. No.: WO2011/042325
PCT Pub. Date: Apr. 14, 2011

(65) Prior Publication Data
US 2012/0193669 A1   Aug. 2, 2012

(30) Foreign Application Priority Data
Oct. 6, 2009   (DE) .................. 10 2009 048 401

(51) Int. Cl.
*H01L 21/00* (2006.01)
*H01L 33/50* (2010.01)
*H01L 33/38* (2010.01)

(52) U.S. Cl.
CPC ......... *H01L 33/50* (2013.01); *H01L 2933/0041* (2013.01); *H01L 33/38* (2013.01)
USPC ........................... 438/70; 438/29; 257/E21.5

(58) Field of Classification Search
None
See application file for complete search history.

(56) References Cited

U.S. PATENT DOCUMENTS

| | | | |
|---|---|---|---|
| 6,858,456 | B2 | 2/2005 | Noguchi et al. |
| 2005/0148110 | A1* | 7/2005 | Ott et al. .......................... 438/69 |
| 2005/0274967 | A1 | 12/2005 | Martin et al. |
| 2007/0221867 | A1 | 9/2007 | Beeson et al. |
| 2009/0014744 | A1 | 1/2009 | Hsieh et al. |
| 2010/0171215 | A1 | 7/2010 | Fischer et al. |
| 2010/0276722 | A1 | 11/2010 | Baur et al. |
| 2012/0062113 | A1* | 3/2012 | Tang et al. ...................... 315/32 |

FOREIGN PATENT DOCUMENTS

| | | |
|---|---|---|
| DE | 10 2007 046 337 | 4/2009 |
| DE | 10 2007 053 067 | 4/2009 |
| JP | 2004-119743 | 4/2004 |
| JP | 2007-066969 | 3/2007 |
| JP | 2008-294224 | 12/2008 |
| JP | 2010-532089 | 9/2010 |
| WO | WO 97/50132 | 12/1997 |

(Continued)

Primary Examiner — Cheung Lee
(74) Attorney, Agent, or Firm — Cozen O'Connor

(57) ABSTRACT

A method for manufacturing an optoelectronic semiconductor component, comprising: providing a semiconductor chip in a composite wafer, comprising an active side for emitting a primary radiation and a contact terminal which is arranged on the active side; depositing a coupling element on the active side; attaching a luminescence conversion element, for converting part of the primary radiation into a secondary radiation, to the coupling element.

21 Claims, 6 Drawing Sheets

(56) References Cited

FOREIGN PATENT DOCUMENTS

| WO | WO 98/12757 | 3/1998 |
| WO | WO 2004/040661 | 5/2004 |
| WO | WO 2008/104936 | 9/2008 |
| WO | WO 2009/003435 | 1/2009 |
| WO | WO 2009/046576 | 4/2009 |
| WO | WO 2009/048704 | 4/2009 |
| WO | WO 2009/075972 | 6/2009 |

* cited by examiner

CONTACTING AN OPTOELECTRONIC SEMICONDUCTOR COMPONENT THROUGH A CONVERSION ELEMENT AND CORRESPONDING OPTOELECTRONIC SEMICONDUCTOR COMPONENT

RELATED APPLICATIONS

This is a U.S. national stage under 35 U.S.C. §371 of International Application No. PCT/EP2010/064241, filed on Sep. 27, 2010, and claims priority on German patent application No. 10 2009 401.9, filed on Oct. 6, 2009, the entire content of which is hereby incorporated by reference.

FIELD OF THE INVENTION

The present invention relates to a method for manufacturing an optoelectronic semiconductor component and an optoelectronic semiconductor component.

BACKGROUND OF THE INVENTION

An example of an optoelectronic semiconductor component features a luminescence conversion element. Such a component is known from the publication [1], for example. It comprises an optoelectronic semiconductor chip that emits a primary radiation during operation, and a luminescence conversion element in which part of the primary radiation is converted into a secondary radiation of a different wavelength. The resulting radiation is derived from the superimposition of the primary radiation which is transmitted by the luminescence conversion element and the secondary radiation that is generated. In particular, it is thus possible to provide light sources which emit a white light.

During the manufacture of the semiconductor components, it is problematic in particular that a spectral locus of the primary radiation of the semiconductor chip is subject to a certain fabrication variability in the spectral range. It is desirable to select the luminescence conversion element according to the respective spectral locus and assign it to the semiconductor chip, in order thus to obtain a light source having the desired emission characteristics.

SUMMARY OF THE INVENTION

One object of the present invention is to provide a technique that addresses the problem of manufacturing an optoelectronic semiconductor component which has a desired spectral locus, and a corresponding semiconductor component.

EXEMPLARY EMBODIMENTS

In accordance with one aspect of the present invention, various embodiments of a method for manufacturing an optoelectronic semiconductor component comprise the following steps:
  providing a semiconductor chip in a composite wafer, comprising an active side for emitting a primary radiation and a contact terminal which is arranged on the active side;
  depositing a coupling element onto the active side;
  attaching a luminescence conversion element, for converting part of the primary radiation into a secondary radiation, to the coupling element.

In accordance with another aspect of the present invention, various embodiments of an optoelectronic semiconductor component feature a sequence of semiconductor layers having an active side for the emission of primary radiation and a contact terminal which is arranged on the active side. A luminescence conversion element is arranged on the active side, a coupling element being provided between the active side and the luminescence conversion element.

Various embodiments include a luminescence conversion element that is deposited onto a semiconductor chip which is already equipped with a contact terminal. The deposition of the luminescence conversion element takes place before the semiconductor chip is contacted (e.g. by means of a bonding wire) and encapsulated in a package. In particular, this allows the sale of white unpackaged semiconductor chips. It also allows the provision of semiconductor chips that are packaged as a wafer level package (WLP). In the context of WLP, as many steps as possible relating to contacting and packaging are already performed at wafer level, i.e. before the separation. This results in a semiconductor component that is only slightly larger than the semiconductor chip.

After separation, the semiconductor chip is equipped with electronic contacts, wherein process steps such as deposition on a lead frame or carrier and/or attachment of bonding wires (bonding) can be performed. Once the semiconductor chip has been installed in a chip package, it is referred to as a semiconductor component.

In the following, a composite wafer is any arrangement that comprises a multiplicity of unpackaged semiconductor chips. For example, this can be a semiconductor wafer (in particular an undiced semiconductor wafer) comprising a multiplicity of individual semiconductor chips. Likewise, the composite wafer can be a carrier onto which a multiplicity of unpackaged but already separated semiconductor chips is attached in order to allow further processing thereof. This is also known as an artificial wafer. The semiconductor chips are preferably fixed to the carrier, e.g. by pouring an encapsulating material such as silicone around them. Likewise, the semiconductor chips can be installed in seats in the carrier for the purpose of fixing.

The coupling element is used for coupling the luminescence conversion element to the semiconductor chip. It is attached to the active side of the optoelectronic semiconductor chip. It preferably features a high degree of photostability and heat stability. The material is typically transparent over the spectrum that is emitted by the optoelectronic semiconductor chip. Typical coupling media include materials that are also used in the luminescence conversion element, in particular matrix materials that are used therein. Possible materials for the coupling element are photostructurable materials and/or materials such as glass, silicone, aluminum oxide, adhesive, spin-on-silicon (SoS), spin-on-glass (SoG), benzocyclobutane (BCB), etc. The coupling element can be deposited as a coupling layer by means of spin-on deposition, for example.

A luminescence conversion element is understood to mean any device in which part of the primary radiation emitted by a semiconductor chip is converted into a radiation of a different wavelength. This radiation is referred to as secondary radiation. The luminescence conversion element is manufactured separately from the semiconductor chip. It takes the form of a lamina, for example, which can be deposited onto the active side of the semiconductor chip. The coupling element is used for the purpose of fixing the lamina. The luminescence conversion element normally comprises a radiation-permeable matrix material and a luminophore that is incorporated into the matrix material. The matrix material determines the mechanical characteristics of the luminescence conversion element. A radiation-stable and transparent material is particularly suitable as a matrix material. For example, silicone is a possible option for a primary radiation in the visible range (light). The matrix material can be a film-type flexible layer. It can also be a thermoplastic or duroplastic plastic, for example. The matrix material can be supported by a carrier element or self-supporting. The refractive index of the matrix material is usually selected such that no unwanted scattering effects occur after the luminescence conversion element is attached to the semiconductor chip. In this case, consideration is also given to the refractive index of the semiconductor material or of a coupling layer that may be present, for example.

A luminophore that is incorporated in the matrix material absorbs at least part of the primary radiation and emits secondary radiation of a different wavelength range. Possible luminophores include e.g. inorganic luminophores such as garnets that have been doped with rare earths, for example. It is also possible to use organic luminophores such as perylene, or mixtures of different luminophores. A multiplicity of possible luminophores are known from the document [2], whose disclosure is hereby included in the present document by virtue of reference thereto.

The luminescence conversion element can be embodied as a flat lamina. It can be a film. The exit surface of the luminescence conversion element can be flat. The luminescence conversion element can also feature an exit surface that is suitable for achieving a desired light outcoupling. For this purpose, the luminescence conversion element can be configured e.g. in the form of a lens, which has e.g. a convex curved exit surface. Likewise, the luminescence conversion element can feature a smooth or alternatively a suitably roughened exit surface.

Various embodiments derive from the fundamental idea that a luminescence conversion element is deposited onto a semiconductor chip which is already equipped with a contact terminal. The deposition of the luminescence conversion element takes place before the semiconductor chip is contacted (e.g. by means of a bonding wire) and encapsulated in a package. In particular, this allows the sale of white unpackaged semiconductor chips. It also allows the provision of semiconductor chips that are packaged as a wafer level package (WLP). In the context of WLP, as many steps as possible relating to contacting and packaging are already performed at wafer level, i.e. before the separation. This results in a semiconductor component that is only slightly larger than the semiconductor chip.

The luminescence conversion element can be manufactured separately from the semiconductor chip as an individual element in this case. It is subsequently deposited onto the active side of the semiconductor chip and fixed by means of the coupling element. It is therefore possible to determine the spectrum of the primary radiation using the contact terminals that are already provided, and then to deposit a suitably selected luminescence conversion element onto the active side of the semiconductor chip. In this case, the selection of the luminescence conversion element can be made in such a way that a specific portion or a specific spectrum of the secondary radiation is generated in the luminescence conversion element, such that the superimposed spectrum of the transmitted primary radiation and the generated secondary radiation corresponds to a desired emission spectrum. It is thereby possible to manufacture an optoelectronic semiconductor component which has a desired spectral locus.

In an embodiment of the method, the contact terminal is exposed. Said exposure is effected by means of laser ablation or a photolithographic process, for example. Simple deposition of the luminescent element is permitted if the exposure of the contact terminal takes place subsequently. In particular, the method can be performed such that it is not necessary to ensure that the contact terminal remains uncovered when the coupling element and the luminescent element are deposited.

BRIEF DESCRIPTION OF THE DRAWINGS

Various exemplary embodiments of the inventive solution are described in greater detail below with reference to the drawings. In the figures, the first digit(s) of a reference sign specify the figure in which the reference sign is first used. The same reference signs are used for elements and/or characteristics that are identical or have identical effect in all figures. In the figures.

DETAILED DESCRIPTION OF THE DRAWINGS

Figure 1:
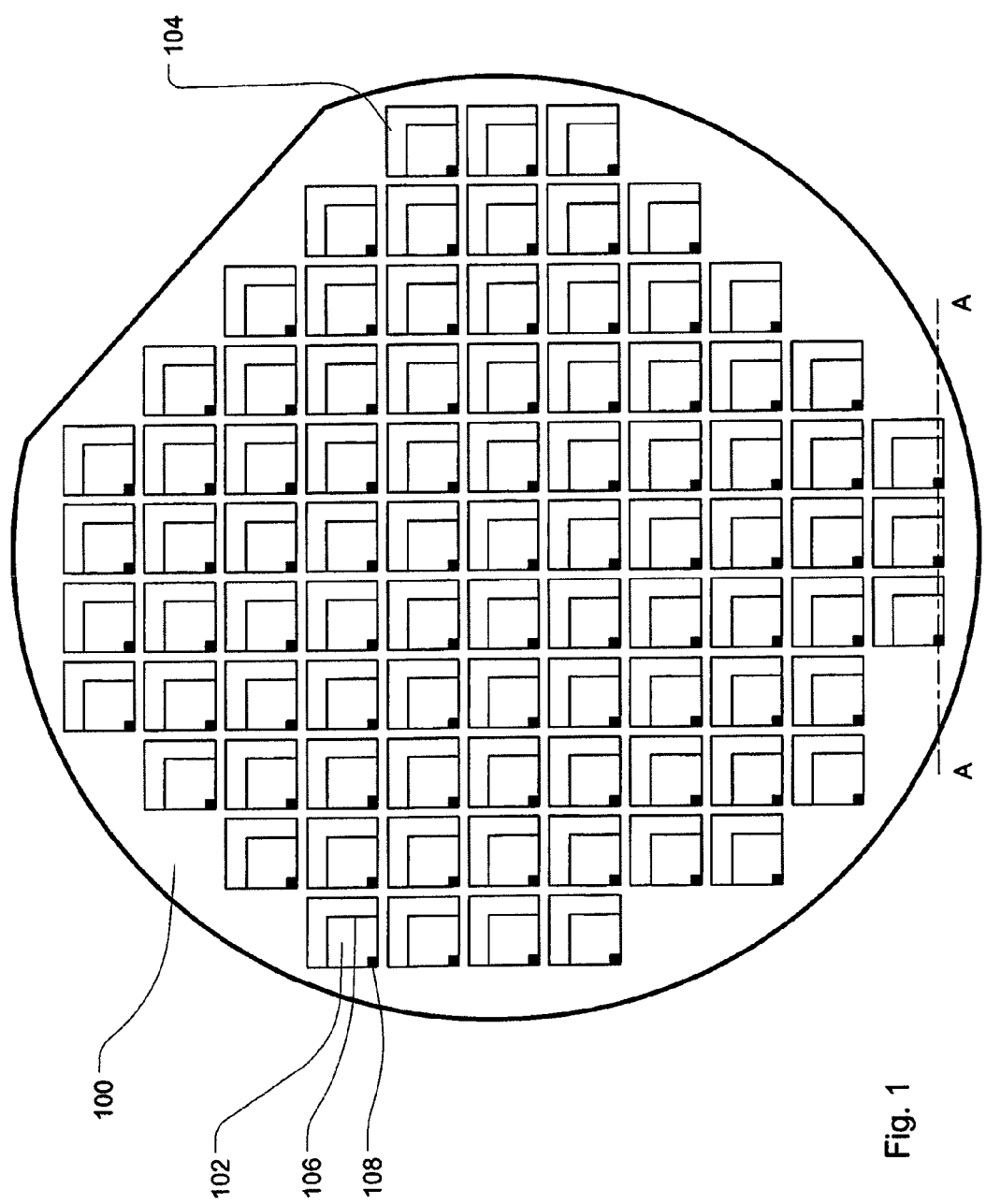
FIG. 1 shows a schematic illustration of a top view of a composite wafer comprising optoelectronic semiconductor components.

FIG. 1 shows a schematic illustration of a top view of a composite wafer 100 comprising optoelectronic semiconductor chips. The composite wafer 100 can be a semiconductor wafer. The semiconductor wafer contains a semiconductor material such a silicon, for example. During the manufacture of an optoelectronic semiconductor component, III-V compound semiconductors such as e.g. gallium nitride or indium nitride are normally used instead of a silicon substrate, said III-V compound conductors being deposited e.g. epitaxially on an SiC substrate. During the processing of the semiconductor wafer, a sequence of semiconductor layers having a radiation-emitting active zone is created. In this case, the active zone features e.g. a radiation-generating pn transition zone or a radiation-generating single or multiple quantum structure. The manifold structures and methods for manufacturing semiconductor components are known to a person skilled in the art and therefore require no explanation. The radiation that is generated when an electric voltage is applied in the active zone is emitted via an active side of the semiconductor chip. The active side is shown in the top view of the composite wafer 100.

The composite wafer 100 can also be an artificial wafer. An artificial wafer is created from semiconductor chips that have been separated. In order to achieve this, the semiconductor chips can be deposited onto a shared carrier and then fixed thereon, e.g. by means of an encapsulating material. The artificial wafer can also feature a multiplicity of receptacles, into which the individual semiconductor chips are installed with the active side upwards. The semiconductor chips in the artificial wafer are available for further processing.

The composite wafer 100 comprises a chip matrix which contains a first semiconductor chip 102 and a second semiconductor chip 104. The active sides are shown on the semiconductor chips. The respective front-side contact pads are deposited onto said active sides. In the illustration, the first semiconductor chip 102 therefore features a current distribution terminal 106 and a contact terminal 108 on its active side. The current distribution terminal 106 is used to feed a supplied electric current via the active side into the active zone. The contact terminal 108, which is connected to the current distribution terminal in an electrically conductive manner, is used for contacting to a terminal electrode, e.g. via a bonding wire and a lead frame.

A luminescence conversion element is then deposited onto the semiconductor chips that are arranged in the chip matrix. The deposition is explained in greater detail below with reference to two exemplary embodiments.

EXEMPLARY EMBODIMENTS OF THE METHOD FOR MANUFACTURING AN OPTOELECTRONIC SEMICONDUCTOR COMPONENT

FIGS. 2a to 2e show a schematic illustration of method steps in the manufacture of an optoelectronic semiconductor component with reference to a section through the composite wafer shown in FIG. 1 and along a sectional axis A-A thereof.

Figure 2A:
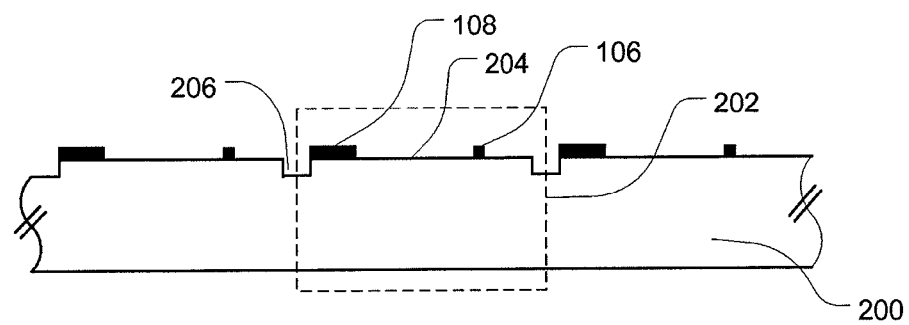
FIGS. 2a to 2e show a schematic illustration of method steps in the manufacture of an optoelectronic semiconductor component with reference to a section through the composite wafer shown in FIG. 1 and along a sectional axis A-A thereof.

FIG. 2a shows a cross section of a processed semiconductor wafer 200 comprising a multiplicity of semiconductor chips. An exemplary semiconductor chip 202 or semiconductor lamina is identified (marked dashed). It features an active side 204 and is separated from an adjacent semiconductor chip to its left by means of a dicing trench 206. The dicing trench 206 is a marginal region between two semiconductor chips. The clearance thus defined is produced as a result of a strip being cut away when the semiconductor wafer 200 is diced up. The cross sections of the current distribution terminal 106 and of the contact terminal 108 on the top side, i.e. the light outlet side or active side of the semiconductor chip 202, are likewise shown. The individual semiconductor chips can therefore already be electrically contacted and measured for their spectral characteristics.

Figure 2B:
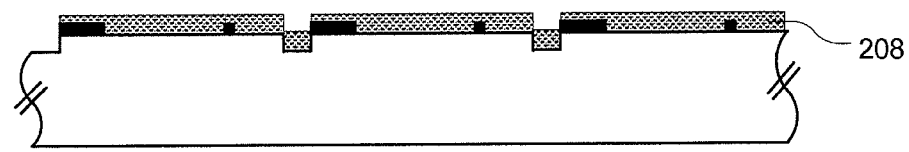

Following the provision of a semiconductor chip in the semiconductor wafer 200, a coupling element in the form of a coupling layer 208 is deposited onto the active side of the semiconductor chip as shown in FIG. 2b. The coupling layer 208 covers at least parts of the surface of the semiconductor wafer 200. It would likewise be possible to deposit the coupling layer 208 in the form of individual lamina or drops onto a respective semiconductor chip.

Figure 2C:
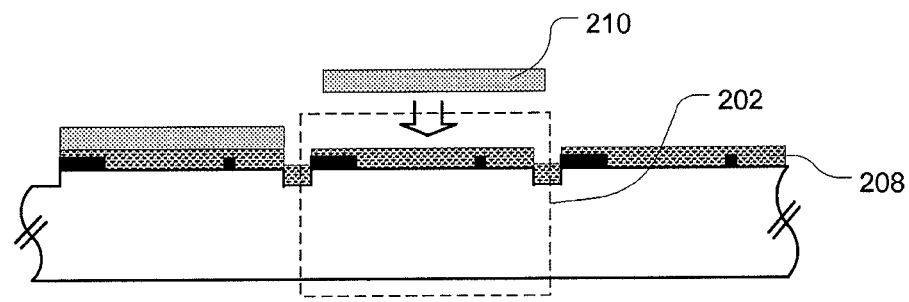

In a method step following thereupon as illustrated in FIG. 2c, luminescence conversion elements are deposited onto the active sides of the semiconductor chips.

In this case, a presorted luminescence conversion element 210 is deposited onto the semiconductor chip 202. The luminescence conversion element 210 is sorted in such a way that a desired spectral characteristic for the semiconductor chip 202, e.g. a specific spectral locus according to the CIE system, is achieved for the subsequently emitted radiation. Following the deposition of the luminescence conversion element 210, this is fixed onto the semiconductor chip 202. To this end, the coupling layer can be cured, for example. This is done by applying heat and/or radiation, for example.

Figure 2D:
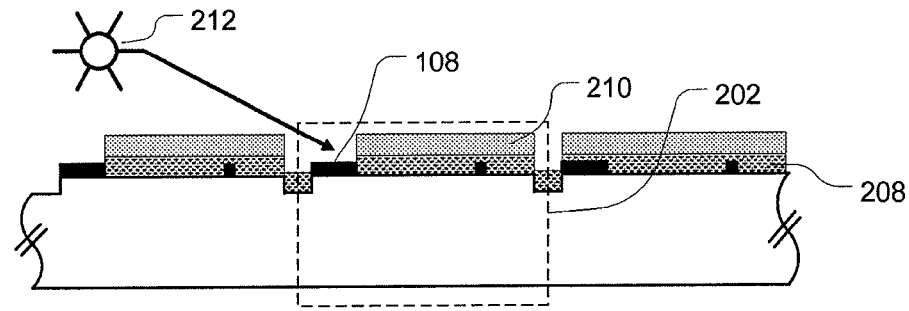

In a further method step as illustrated in FIG. 2d, the contact terminal 108 of the semiconductor chip is exposed. As indicated schematically in the figure, this can be achieved by means of laser ablation. Laser ablation is understood to mean the removal of material from a surface by bombarding it with pulsed laser radiation. For this purpose, provision is made for a laser source 212 from which pulsed laser radiation is directed onto that region of the luminescence conversion element 210 which covers the contact terminal 108. In this case, possible laser sources include carbon dioxide laser or UV laser.

As a result of the laser ablation, the material of the luminescence conversion element 210 and the coupling layer 208 over the contact terminal 108 is removed by vaporization. In order to eliminate any resulting impurities or residues of the luminescence conversion element material on the contact terminal 108, cleaning methods involving e.g. high-pressure water cleaning and/or an $O_2$—$CF_4$ cleaning plasma can be used.

Other options for exposing the contact terminal are also possible. For example, the coupling layer 208 and the matrix material of the luminescence conversion element 210 can consist of photostructurable materials. In this way, it is possible to expose the contact terminal 108 by means of a photolithographic process.

Figure 2E:
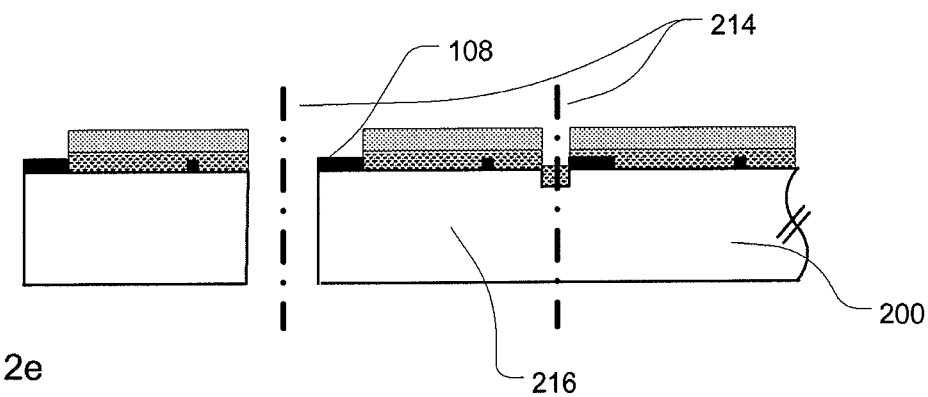

Following the exposure of the contact terminal 108, the semiconductor component 200 is separated in a method step that is illustrated in FIG. 2e. To this end, the semiconductor wafer 200 is sawn through along dicing lines 214 in the dicing trench. Other separation methods are also possible, e.g. laser separation. The separation results in a separated optoelectronic semiconductor chip 216. The separated semiconductor chip 216 has a connectable contact terminal 108, and can therefore be tested e.g. for a color temperature of the emitted spectrum before installation in a package. The separated semiconductor chip can be installed with another semiconductor chip in a shared package as a multi-LED module.

Figure 3:
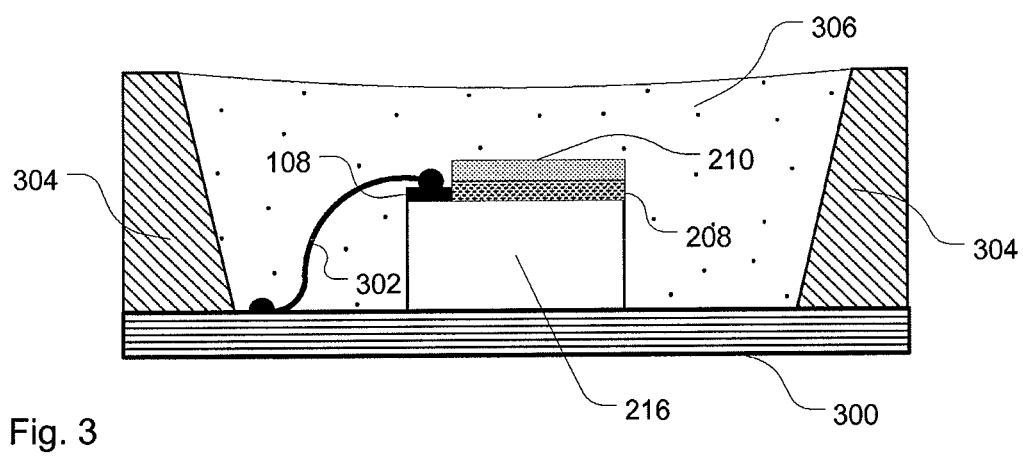
FIG. 3 shows a schematic illustration of an embodiment of an optoelectronic semiconductor component.

FIG. 3 shows a schematic illustration of an embodiment of an optoelectronic semiconductor component. In this case, a separated semiconductor chip 216 is deposited onto a carrier 300. The separated semiconductor chip 216 is covered by a luminescence conversion element 210. The luminescence conversion element 210 is fixed by means of a coupling layer 208 to an active side of the separated semiconductor chip 216. A contact terminal 108 of the separated semiconductor chip 216 is exposed. The contact terminal 108 is connected to the carrier 300 via a bonding wire 302. A reflector 304 is mounted on the carrier 300 and surrounds the separated semiconductor chip 216. A recess in the reflector 304 contains an encapsulating material 306, which encloses the separated semiconductor chip 216 and the bonding wire 302.

Depending on the package selected, the carrier 300 can be a lead frame or a substrate. It allows the mechanical stabilization of the optoelectronic semiconductor component and/or the electrical connection of the separated semiconductor chip 216 to external electrical contacts, for example.

The reflector 304 serves to outcouple radiation that is emitted by the separated semiconductor chip 216. It can feature smooth inner surfaces. The inner surfaces can also be structured, e.g. in order to achieve better emission performance of the optoelectronic semiconductor component. The lateral inner surfaces can be formed vertically in the reflector 304. The lateral inner surfaces can also take the form of a slope, e.g. being so formed that the recess widens in the direction of the opening. These sloping forms typically deviate by an angle of more than 4° from the perpendicular relative to the carrier 300. This likewise improves the emission performance of the optoelectronic semiconductor component.

The encapsulating material 306 is normally a transparent material. An encapsulating material 306 can be e.g. a transparent material whose characteristics include cationic curing that is initiated by UV or light. For example, a silicone or an epoxy resin can be used for the encapsulating material 306. Acrylic resins such as PMMA or silicone resins can also be used. The encapsulating material 306 can contain a diffuser material, in order to allow a diffuse radiation outcoupling of radiation that is generated in the optical elements. For this purpose, the encapsulating material 306 can contain diffuser particles that are distributed in the encapsulating material 306. These serve to scatter (in a diffused manner) any radiation (such as light) that hits them. The encapsulating material 306 can likewise contain absorber materials, in order to influence the optical characteristics of the optoelectronic semiconductor component as required.

FIGS. 4a to 4e show a schematic illustration of method steps in the manufacture of an optoelectronic semiconductor component with reference to a section through the composite wafer shown in FIG. 1 and along a sectional axis A-A thereof. Unless otherwise indicated, those method steps that are not illustrated can be supplemented or replaced by corresponding method steps of the exemplary embodiment as per FIGS. 2a to 2e.

A processed semiconductor wafer is first provided as illustrated in FIG. 2a. The exemplary embodiment as per FIGS. 4a to 4e differs from the exemplary embodiment as per FIGS. 2a to 2e in that the processed semiconductor wafer is already separated in this method step. Separated semiconductor chips are therefore available. The spectral locus that is to be assigned to the radiation emitted by the respective semiconductor component is determined for each semiconductor chip. The semiconductor chips can be sorted according to the spectral locus. The semiconductor chips can also be sorted according to other criteria, such as e.g. the peak wavelength of the spectrum of the primary radiation.

Figure 4A:
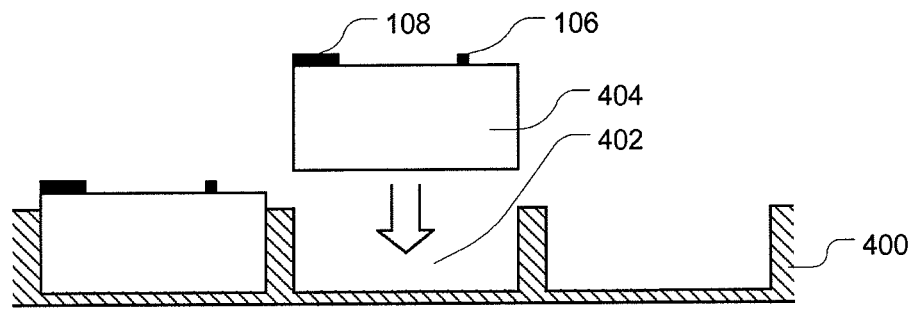
FIGS. 4a to 4e show a schematic illustration of method steps in the manufacture of an optoelectronic semiconductor component with reference to a section through the composite wafer shown in FIG. 1 and along a sectional axis A-A thereof.

FIG. 4a shows an artificial wafer 400. The artificial wafer 400 features a receptacle 402 into which a processed and separated semiconductor chip 404 is installed. The artificial wafer 400 is therefore available for further processing of the installed semiconductor chips. The artificial wafer comprises a sorted selection of semiconductor chips.

Alternatively, the artificial wafer 400 merely features positions at which the separated semiconductor chip 404 is arranged. The semiconductor chips arranged thus are then fixed by means of an encapsulating material. The positions can be identified by small receptacles 402, for example.

The artificial wafer 400 can be further processed in the same way as the method steps illustrated in FIGS. 2b to 2d. Likewise, the method steps illustrated below in relation to FIGS. 4b to FIG. 4d can be transferred correspondingly to the method relating to FIGS. 2a to 2e.

Figure 4B:
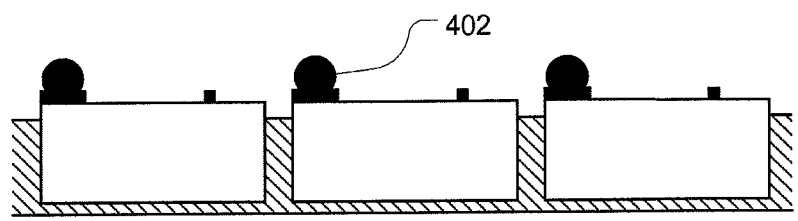
Figure 4C:
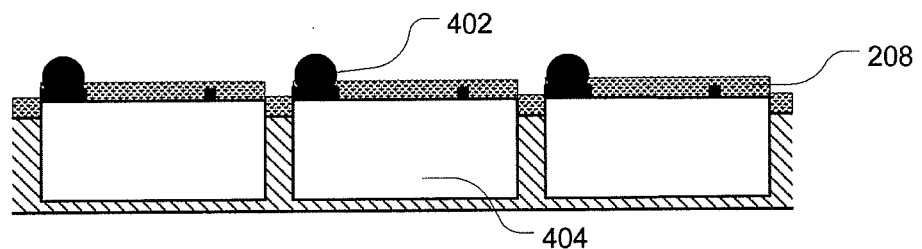
Figure 4D:
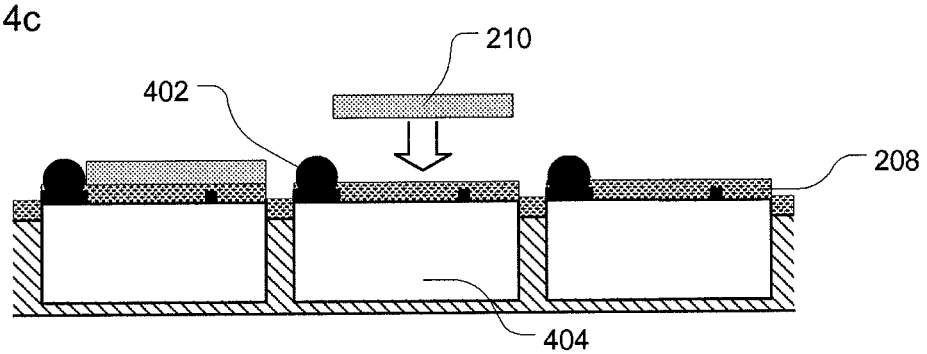
Figure 4E:
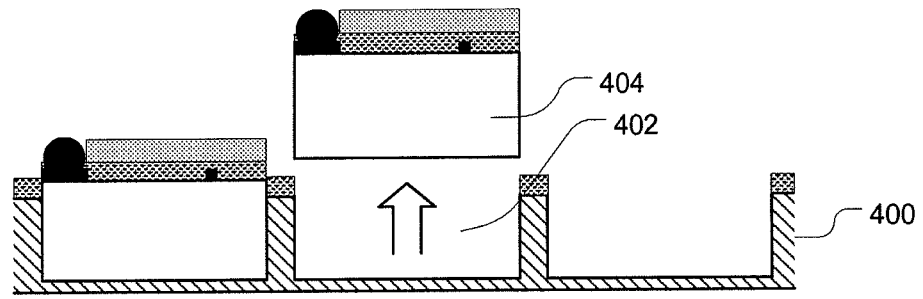

In a method step that is illustrated in FIG. 4b, a solder globule 402 (bump) is deposited onto the contact terminal 108. This can consist of a metal such as gold or an alloy such as a tin alloy, for example. This simplifies subsequent electrical contacting. A coupling layer 208 is then deposited in a method step as illustrated in FIG. 4c. The coupling layer 208 is applied thinly in this case, such that the solder globules 402 project from it. The coupling layer 208 could also be deposited onto the semiconductor chip 404 in the form of individual lamina or drops. Consequently, the solder globule 402 is not covered or is only slightly covered by the coupling layer 208.

In order to ensure that after the attachment of the coupling layer 208 the solder globule 402 only stands out slightly from the component surface that is thus formed, the solder globule 402 can be ground down to a suitable thickness in a subsequent process step.

Following the deposition of the coupling layer 208, a luminescence conversion element 210 corresponding to the spectral locus is deposited onto the semiconductor chip 404. In a similar manner to the method step as per FIG. 2c, the luminescence conversion element 210 is fastened to the semiconductor chip 404 by means of the coupling layer 208. This operation is illustrated schematically in FIG. 4c. In this case, the luminescence conversion element 210 preferably features an opening which leaves the solder globule 402 exposed when the luminescence conversion element 210 is deposited.

The separated semiconductor chip 404 can then be removed from the recess 402 of the artificial wafer 400 and processed further. This method step is illustrated schematically in FIG. 4e. After electrical contacting and installation in a package, the semiconductor chip 404 is e.g. part of an optoelectronic semiconductor component as illustrated in FIG. 3.

Figure 5:
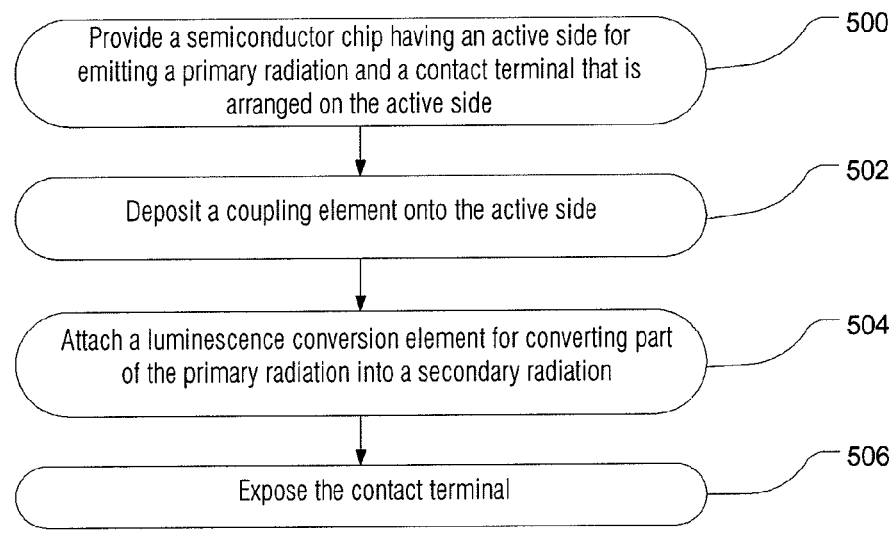
FIG. 5 shows a flow diagram of an exemplary embodiment of a method for manufacturing an optoelectronic semiconductor component.

FIG. 5 shows a flow diagram of an exemplary embodiment of a method for manufacturing an optoelectronic semiconductor component.

In a first step 500, a semiconductor chip is provided which has an active side for emitting a primary radiation and a contact terminal that is arranged on said active side. The semiconductor chip can be part of a processed semiconductor wafer. It is likewise possible for an already separated semiconductor chip to be installed in an artificial wafer or processed individually.

In a second step 502, a coupling element is deposited on the active side. This can be done by the deposition of a coupling layer, for example. It is likewise possible to provide other means for coupling a luminescence conversion element.

In a third step 504, a luminescence conversion element for converting part of the primary radiation into a secondary radiation is attached. The luminescence conversion element is arranged on the active side of the semiconductor chip in this case. It is fixed thereto by means of the coupling element.

Finally, the contact terminal is exposed in a step 506. A post-treatment method step in which the luminescent element and/or the coupling element is cured or tempered for the purpose of stabilization can also take place before or after the exposure.

This manufacturing method results in a semiconductor component that emits radiation in both the primary radiation range and the secondary radiation range when an electric voltage is applied. A further, optional step can be used to check the complete spectrum that is emitted. Moreover, the semiconductor component is provided without a package and is therefore available for the widest possible range of applications.

Figure 6:
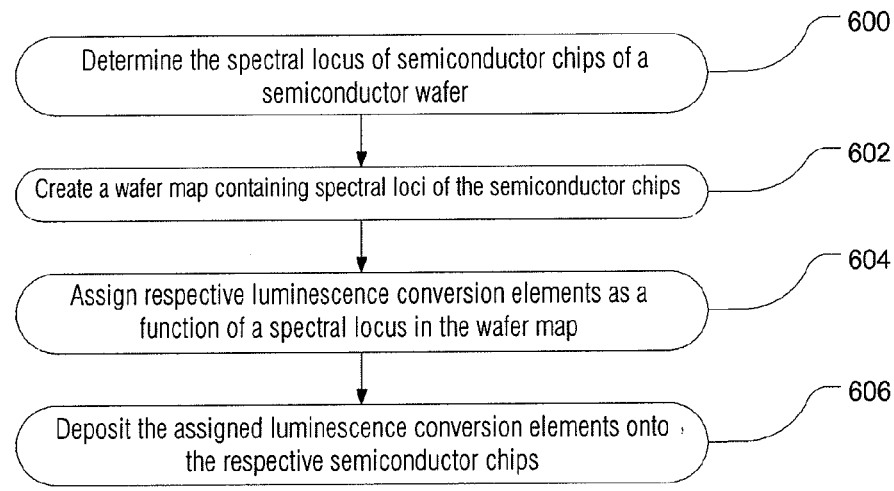
FIG. 6 shows a flow diagram of an exemplary embodiment of method steps during the manufacture of an optoelectronic semiconductor component.

FIG. 6 shows a flow diagram of an exemplary embodiment of method steps during the manufacture of an optoelectronic semiconductor component.

In this case, a first method step 600 provides for determining the respective spectral locus of optoelectronic semiconductor chips which together form a semiconductor wafer. Once the spectral loci have been determined, a wafer map containing spectral loci of the semiconductor chips can be created in a second method step 602 on the basis of this information in combination with the position of the associated semiconductor chip in the semiconductor wafer. The wafer map can be managed as a list, for example, containing the data that has been determined and the relationships between said data.

Using the wafer map, it is possible to assign a corresponding luminescence conversion element to each of the semiconductor chips in order to achieve a desired radiation characteristic of the semiconductor component. The assignment of the luminescence conversion element to a semiconductor chip takes place in a third method step 604. The associated luminescence conversion element is then deposited onto the corresponding semiconductor chip in a method step 606.

Figure 7:
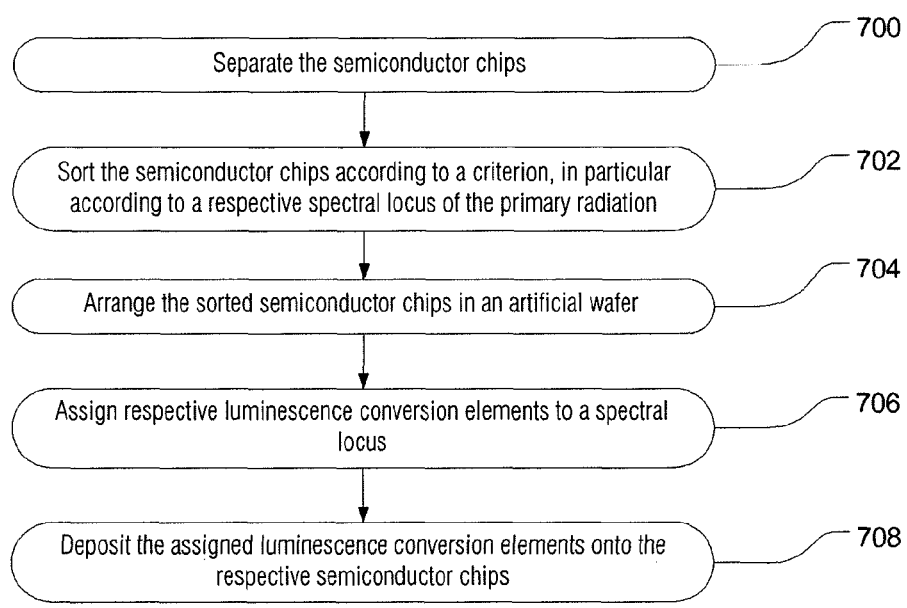
FIG. 7 shows a flow diagram of a further exemplary embodiment of method steps during the manufacture of an optoelectronic semiconductor component.

FIG. 7 shows a flow diagram of a further exemplary embodiment of method steps during the manufacture of an optoelectronic semiconductor component.

In a first method step 700, the semiconductor chips are separated. The spectral loci of the primary radiation are determined for each semiconductor chip before or after the separation. Other physical characteristics can also be determined, e.g. the peak wavelength of the primary radiation. In a second method step 702, the separated semiconductor chips are then sorted according to the physical characteristics. For example, a group of semiconductor chips having similar physical characteristics within certain tolerances, e.g. a similar spectral locus of the primary radiation, can be combined in each case.

In a third method step 704, the sorted semiconductor chips are arranged in an artificial wafer. Provision is preferably made for arranging semiconductor chips from a combined group in an artificial wafer, thereby allowing shared further processing without having to consider variations in the semiconductor chips.

In a fourth method step 706, luminescence conversion elements are assigned to a specific spectral locus, i.e. to a specific group of semiconductor chips, and are deposited onto said semiconductor chips in a fifth method step 708.

The luminescence conversion element can be of such a size that it extends over a plurality of semiconductor chips. This is particularly advantageous if the semiconductor wafer or a composite wafer has domains of semiconductor chips whose spectral loci lie within a predefined tolerance. A luminescence conversion element can be assigned to a domain accordingly, and deposited on the semiconductor chips of the domain. This variant is particularly advantageous in the case of an artificial wafer in which semiconductor chips are sorted and arranged according to their spectral locus. A single luminescence conversion element initially covers a multiplicity of semiconductor chips, and is fixed to these by means of the coupling material. In a next step, the luminescence conversion element is cut to size on each semiconductor chip, e.g. by means of laser separation. This can be done in a method step in conjunction with the separation of the semiconductor chip, for example. In another embodiment, it is done before separation of the semiconductor chip.

With regard to the method described here, the method steps as per FIG. 6 can be executed in connection with the embodiment of the method as described in FIGS. 2*a* to 2*e*, and the method steps as per FIG. 7 can be executed in connection with the embodiment of the method as described in FIGS. 4*a* to 4*e*. However, it is also possible to combine all method steps as desired, provided that preceding method steps allow this. For example, the method described in FIG. 6 can be executed in connection with the attachment of solder globules as described with reference to FIGS. 4*b* to 4*d*.

CONCLUDING STATEMENT

The optoelectronic semiconductor component and the method for manufacturing an optoelectronic semiconductor component have been described with reference to certain exemplary embodiments in order to illustrate the fundamental idea of the invention. The exemplary embodiments are not restricted to specific combinations of features in this case. Although certain features and configurations have only been described in connection with a particular exemplary embodiment or individual exemplary embodiments, they can be combined with other features from other exemplary embodiments in each case. Likewise, individual illustrated features or particular configurations can be omitted from or added to exemplary embodiments, provided that the general technical teaching is nonetheless realized.

Although the steps of the method for manufacturing an optoelectronic semiconductor component are described in a specific sequence, it is understood that each of the methods described in this disclosure can be performed in any other suitable sequence, wherein method steps can also be omitted or added, provided that the fundamental idea of the described technical teaching is respected.

The invention claimed is:

1. A method for manufacturing an optoelectronic semiconductor component, comprising:
   providing a semiconductor chip in a composite wafer, the semiconductor chip comprising an active side for emitting a primary radiation and a contact terminal which is arranged on the active side, and the composite wafer being an artificial wafer comprising sorted semiconductor chips;
   depositing a coupling element on the active side of the provided semiconductor chip;
   attaching a luminescence conversion element, for converting part of the primary radiation into a secondary radiation, to the coupling element; and
   exposing the contact terminal of the semiconductor chip, wherein the exposure of the contact terminal is effected by means of laser ablation.

2. The method of claim 1, further comprising:
   providing a processed semiconductor wafer comprising semiconductor chips;
   separating the processed semiconductor wafer in order to provide separated semiconductor chips;
   determining spectral loci of semiconductor chips before or after the separation;
   sorting semiconductor chips according to the spectral locus; and
   arranging semiconductor chips in the artificial wafer on the basis of the determined spectral loci.

3. The method of claim 2,
   wherein the step relating to attaching a luminescence conversion element includes depositing a luminescence conversion element that extends over a plurality of semiconductor chips.

4. The method of claim 3, further comprising:
   cutting the luminescence conversion element to size on each semiconductor chip of the plurality of semiconductor chips.

5. The method of claim 1, wherein the luminescence conversion element is selected according to a spectral locus of the semiconductor chip.

6. The method of claim 1, wherein the coupling element comprises at least one of the following materials:
   glass,
   silicone,
   aluminum oxide, or
   an adhesive.

7. A method for manufacturing an optoelectronic semiconductor component, comprising:
   providing a semiconductor chip in a composite wafer, the semiconductor chip comprising an active side for emitting a primary radiation and a contact terminal which is arranged on the active side, and the composite wafer being an artificial wafer comprising sorted semiconductor chips;

depositing a coupling element on the active side of the provided semiconductor chip;

attaching a luminescence conversion element, for converting part of the primary radiation into a secondary radiation, to the coupling element; and exposing the contact terminal of the semiconductor chip, wherein the exposure of the contact terminal is effected by means of a photolithographic process.

8. The method of claim 7, further comprising:
providing a processed semiconductor wafer comprising semiconductor chips;
separating the processed semiconductor wafer in order to provide separated semiconductor chips;
determining spectral loci of semiconductor chips before or after the separation;
sorting semiconductor chips according to the spectral locus; and
arranging semiconductor chips in the artificial wafer on the basis of the determined spectral loci.

9. The method of claim 8, wherein the step relating to attaching a luminescence conversion element includes depositing a luminescence conversion element that extends over a plurality of semiconductor chips.

10. The method of claim 9, further comprising:
cutting the luminescence conversion element to size on each semiconductor chip of the plurality of semiconductor chips.

11. The method of claim 7, wherein the luminescence conversion element is selected according to a spectral locus of the semiconductor chip.

12. The method of claim 7, wherein the coupling element comprises at least one of the following materials:
glass,
silicone,
aluminum oxide, or
an adhesive.

13. A method for manufacturing an optoelectronic semiconductor component, comprising:
providing a semiconductor chip in a composite wafer, the semiconductor chip comprising an active side for emitting a primary radiation and a contact terminal which is arranged on the active side, and the composite wafer being an artificial wafer comprising sorted semiconductor chips;
depositing a coupling element on the active side of the provided semiconductor chip;
attaching a luminescence conversion element, for converting part of the primary radiation into a secondary radiation, to the coupling element;
providing a processed semiconductor wafer comprising semiconductor chips;
separating the processed semiconductor wafer in order to provide separated semiconductor chips;
determining spectral loci of semiconductor chips before or after the separation;
sorting semiconductor chips according to the spectral locus; and
arranging semiconductor chips in the artificial wafer on the basis of the determined spectral loci,
wherein sorting the semiconductor chips is carried out in order to provide a group of semiconductor chips having a similar spectral locus within a predefined tolerance, and
wherein the group of semiconductor chips is arranged in a domain of the artificial wafer.

14. The method of claim 13, further comprising:
assigning luminescence conversion elements to the group of semiconductor chips; and
depositing the assigned luminescence conversion elements on semiconductor chips of the group.

15. The method of claim 13, further comprising:
assigning the luminescence conversion element to the group of semiconductor chips; and
depositing the luminescence conversion element on the semiconductor chips of the group such that the luminescence conversion element covers the semiconductor chips of the group.

16. The method of claim 15, further comprising:
cutting the luminescence conversion element to size on each semiconductor chip of the semiconductor chips of the group.

17. A method for manufacturing an optoelectronic semiconductor component, comprising:
providing sorted semiconductor chips in an artificial wafer, the semiconductor chips comprising an active side for emitting a primary radiation and a contact terminal which is arranged on the active side;
depositing a coupling material on the active side of the provided sorted semiconductor chips; and
attaching a luminescence conversion element, for converting part of the primary radiation into a secondary radiation, to the coupling material,
wherein the artificial wafer comprises a group of semiconductor chips having a similar spectral locus within a predefined tolerance, and
wherein the luminescence conversion element is of such a size and is attached in such a way that the luminescence conversion element extends over the semiconductor chips of the group.

18. The method of claim 17, further comprising:
cutting the luminescence conversion element to size on each semiconductor chip of the semiconductor chips of the group.

19. A method for manufacturing an optoelectronic semiconductor component, comprising:
providing semiconductor chips in a composite wafer, the semiconductor chips comprising an active side for emitting a primary radiation and a contact terminal which is arranged on the active side;
depositing a coupling material on the active side of the provided semiconductor chips; and
attaching a luminescence conversion element, for converting part of the primary radiation into a secondary radiation, to the coupling material,
wherein the composite wafer comprises a domain of semiconductor chips having a similar spectral locus within a predefined tolerance, and
wherein the luminescence conversion element is of such a size and is attached in such a way that the luminescence conversion element extends over the semiconductor chips of the domain.

20. The method of claim 19, further comprising:
cutting the luminescence conversion element to size on each semiconductor chip of the semiconductor chips of the domain.

21. The method of claim 20,
wherein cutting the luminescence conversion element is carried out in conjunction with a separation of semiconductor chips or before a separation of semiconductor chips.

* * * * *